United States Patent
Sun et al.

(10) Patent No.: US 10,033,305 B2
(45) Date of Patent: Jul. 24, 2018

(54) ENERGY HARVESTING DEVICE AND METHOD FOR FORMING THE SAME

(71) Applicant: AGENCY FOR SCIENCE, TECHNOLOGY AND RESEARCH, Singapore (SG)

(72) Inventors: Chengliang Sun, Singapore (SG); Xiaojing Mu, Singapore (SG); Ilker Ender Ocak, Singapore (SG); Alex Yuandong Gu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 474 days.

(21) Appl. No.: 14/550,863

(22) Filed: Nov. 21, 2014

(65) Prior Publication Data
US 2015/0145376 A1    May 28, 2015

(30) Foreign Application Priority Data
Nov. 22, 2013   (SG) ................................ 201308685-5

(51) Int. Cl.
*H02N 2/18* (2006.01)
*H01L 41/113* (2006.01)

(52) U.S. Cl.
CPC ......... *H02N 2/188* (2013.01); *H01L 41/1134* (2013.01); *H01L 41/1136* (2013.01); *Y10T 29/42* (2015.01)

(58) Field of Classification Search
CPC . H02N 2/188; H01L 41/1134; H01L 41/1136; Y10T 29/42
USPC ........................................ 310/339; 290/1 R
See application file for complete search history.

(56) References Cited

U.S. PATENT DOCUMENTS

| | | | |
|---|---|---|---|
| 6,858,970 B2 | 2/2005 | Malkin et al. | |
| 6,921,952 B2 | 7/2005 | Jeong | |
| 7,439,657 B2 | 10/2008 | Clingman et al. | |
| 7,687,977 B2 | 3/2010 | Xu | |
| 7,737,608 B2 | 6/2010 | Ruggeri et al. | |
| 7,948,153 B1* | 5/2011 | Kellogg | H01L 41/1136 310/329 |
| 8,319,402 B1 | 11/2012 | Churchill et al. | |

(Continued)

FOREIGN PATENT DOCUMENTS

EP    2 610 935 A1    7/2013

OTHER PUBLICATIONS

R. Elfrink, et al., "Shock Induced Energy Harvesting with a MEMS Harvester for Automotive Applications", IEEE International Electron Devices Meeting (IEDM), 4 pgs., (2011).
Arman Hajati, et al., "Ultra-Wide Bandwidth Piezoelectric Energy Harvesting", Applied Physics Letters, vol. 99, pp. 083105-1-083105-3, (2011).

(Continued)

*Primary Examiner* — Bryan Gordon
(74) *Attorney, Agent, or Firm* — Womble Bond Dickinson (US) LLP

(57) ABSTRACT

According to embodiments of the present invention, an energy harvesting device is provided. The energy harvesting device includes a plurality of energy harvesting elements, each energy harvesting element including a transducer, and at least one spring arranged in between at least two energy harvesting elements of the plurality of energy harvesting elements to mechanically couple the at least two energy harvesting elements to each other. According to further embodiments of the present invention, a method for forming an energy harvesting device is also provided.

19 Claims, 9 Drawing Sheets

(56) References Cited

U.S. PATENT DOCUMENTS

| | | | |
|---|---|---|---|
| 8,373,332 B2 | 2/2013 | Lee | |
| 2006/0217776 A1* | 9/2006 | White | A61N 1/3785 607/35 |
| 2008/0174273 A1* | 7/2008 | Priya | H01L 41/1136 320/114 |
| 2008/0252174 A1* | 10/2008 | Mohammadi | G01L 1/16 310/319 |
| 2009/0267066 A1* | 10/2009 | Yamazaki | H01L 31/03685 257/51 |
| 2012/0068576 A1* | 3/2012 | Lee | H01L 41/1136 310/339 |
| 2013/0238073 A1 | 9/2013 | Makdissi et al. | |
| 2014/0077662 A1* | 3/2014 | Lueke | H01L 41/1136 310/339 |

OTHER PUBLICATIONS

Chengliang Sun, et al., "Piezoelectric Energy Harvesting using Single Crystal $Pb(Mg_{1/3}Nb_{2/3})O_3$ -$xPbTiO_3$(PMN-PT) Device", Journal of Intelligent Material Systems and Structures, vol. 20, pp. 559-568, (2009).

Y.B. Jeon, et al., "MEMS Power Generator with Transverse Mode Thin Film PZT", Sensors and Actuators A, vol. 122, pp. 16-22, (2005).

Huan Xue, et al., "Broadband Piezoelectric Energy Harvesting Devices Using Multiple Bimorphs with Different Operating Frequencies", IEEE Transactions on Ultrasonics, Ferroelectrics, and Frequency Control, vol. 55, No. 9, pp. 2104-2108, (Sep. 2008).

Yonas Tadesse, et al., "Multimodal Energy Harvesting System: Piezoelectric and Electromagnetic", Journal of Intelligent Material Systems and Structures, vol. 20, pp. 625-632, (Mar. 2009).

\* cited by examiner

Top view    Cross-sectional view

ENERGY HARVESTING DEVICE AND METHOD FOR FORMING THE SAME

CROSS-REFERENCE TO RELATED APPLICATION

This application claims the benefit of priority of Singapore patent application No. 201308685-5, filed 22 Nov. 2013, the content of it being hereby incorporated by reference in its entirety for all purposes.

TECHNICAL FIELD

Various embodiments relate to an energy harvesting device and a method for forming an energy harvesting device.

BACKGROUND

Wireless sensors, as well as micro-system integration of micromechanical devices with microelectronic circuits have become more and more important in modern microelectronic systems for industrial and military applications. These sensor systems have become much smaller, more sophisticated and less expensive. In order to power up these wireless sensors with long lasting wireless power sources, researchers have put their effort on energy harvesting devices instead of batteries.

MEMS (Micro-Electro-Mechanical Systems) energy harvesters have attracted much interest in the area of wireless sensors because of their simple structure and potential power density. The energy harvesting capabilities of piezoelectric energy harvesters highly depend on the vibration source, especially frequency matching. However, most vibration sources are frequency-varying or totally random in a certain frequency band. The geometric configuration and dimensions of an energy-harvesting device usually remain unchanged once the device has been implemented. Such a harvesting structure may become less effective in power generation when it operates in such a varying-frequency vibrating system. Hence, developing broadband EH has become an important problem for energy harvesting.

Current broadband EH strategies are: (1) resonance tuning, (2) multimodal tuning which includes multi-proof masses and EH arrays, and (3) frequency up-conversion. However, large size, unstable issues, and complex additional circuit problems limit the energy harvesting applications.

Further, conventional energy harvesters have a high Q (quality factor) and a sharp resonance peak, which may limit the frequencies the energy harvesters can harvest energy.

SUMMARY

According to an embodiment, an energy harvesting device is provided. The energy harvesting device may include a plurality of energy harvesting elements, each energy harvesting element including a transducer, and at least one spring arranged in between at least two energy harvesting elements of the plurality of energy harvesting elements to mechanically couple the at least two energy harvesting elements to each other.

According to an embodiment, a method for forming an energy harvesting device is provided. The method may include forming a plurality of energy harvesting elements, each energy harvesting element including a transducer, and arranging at least one spring in between at least two energy harvesting elements of the plurality of energy harvesting elements to mechanically couple the at least two energy harvesting elements to each other.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 5A shows a model analysis of one half of the energy harvesting device of the embodiment of FIG. 3E, while

DETAILED DESCRIPTION

Figure 1A:
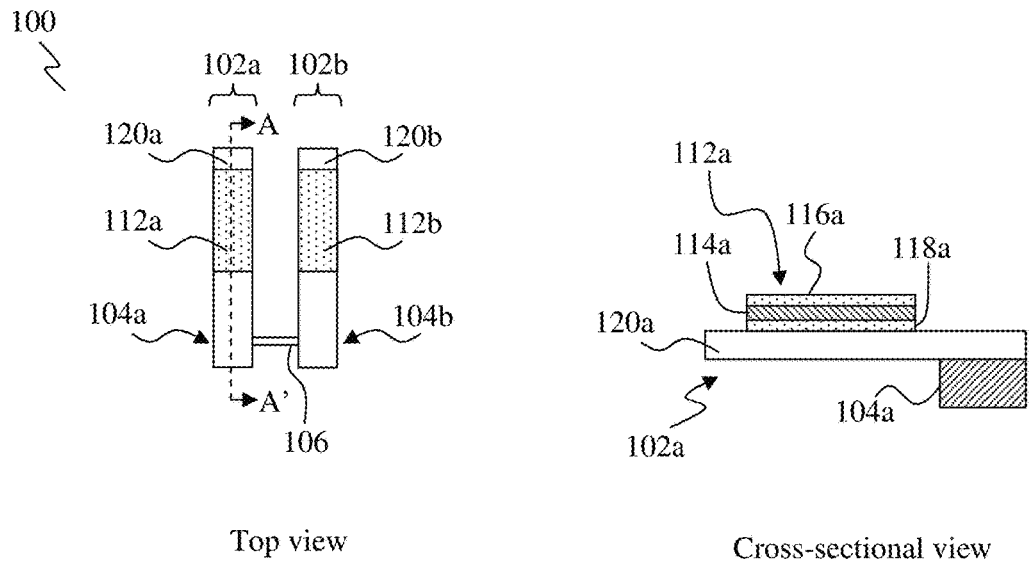
FIG. 1A shows schematic top and cross-sectional views of an energy harvesting device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to Micro-Electro-Mechanical Systems (MEMS) technology, for example, relate to the development of an energy harvesting device for harvesting ambient vibration energy with a wide frequency band.

Various embodiments may relate to at least one of vibration-induced piezoelectric energy harvesters (EH), broadband EHs, or a MEMS piezoelectric device.

Various embodiments may aim towards improvement in the performance of an energy harvester or energy harvesting device (EH) using broadband strategy.

Various embodiments may provide a miniaturized EH, which may be needed, for example, for wireless network applications with a wide frequency band (e.g., for healthcare, structure monitoring, military applications, etc.). Various embodiments may employ MEMS technology to miniaturise the EH.

Various embodiments may provide piezoelectric broadband MEMS (Micro-Electro-Mechanical Systems) energy harvesters.

Various embodiments may provide methods or techniques for broadband energy harvesting, for example, using MEMS. The broadband energy harvester (EH) or energy harvesting device of various embodiments may have a micro structure of a cantilever beam with an end mass (e.g., proof mass) or multi-suspended flexural piezo-on-silicon (piezoelectric material on silicon) beams with a central proof mass configuration. Various embodiments may employ a (one) device which may include a main beam and one or more additional cantilever beam(s) inside the first (main) beam or as an extension from the first (main) beam. For example, a single device which may include multiple proof masses and specially designed multiple beams may be provided. By this way, energy harvesters may have multi-proof mass to realize multi resonant modes. Further embodiments may employ a 1D (one-dimensional) or 2D (two-dimensional) energy harvester or energy harvesting element array which may be mechanically connected through their respective (or associated) proof masses with soft springs so as to realize broadband energy harvesting. These embodiments may form a system of multiple degrees of freedom to realize broadband energy harvesting and to improve the energy harvesting performance.

In various embodiments, the resonant frequency of the EH may be tuned by adjusting the dimensions of the beams and/or the proof mass (e.g., dimensions of the proof mass). As will be described later, methods for simulations are provided, and the simulation results indicate that the frequency band of the EH may be significantly improved.

Various embodiments may provide piezoelectric broadband MEMS energy harvesters. In various embodiments, two methods may be employed to realize broadband energy harvesting with high harvesting efficiency.

One method may include providing an energy harvesting device (EH) having an energy harvesting element, for example, in the form of a clamped-free cantilever beam with an end proof mass (or a general cantilever beam with an end proof mass) or a clamped-clamped beam with a middle (or central) proof mass. The cantilever beam may have a rectangular shape or a triangular shape. However, other suitable shapes may be employed. The energy harvesting device (EH) may include a second cantilever beam with an end proof mass. The second cantilever beam may be part of the energy harvesting element described above. In various embodiments, the clamped-free cantilever beam with an end proof mass or the clamped-clamped beam with a middle (or central) proof mass may act as a main beam. The second cantilever beam and its end mass may be provided in the main beam, or out of the main beam, or in the main beam end mass. In various embodiments, the resonance frequency of the main beam may be different from the additional (second) cantilever beam. It should be appreciated that one or more additional beams may be provided, in addition to the main beam.

Another method may include providing an energy harvesting device (EH) having an array or plurality of energy harvesting elements with proof masses that may be connected together using soft springs. The resonance frequency of each proof mass or of each energy harvesting element of the energy harvesting element array may be different. The soft spring may be of any shape. However, the spring constant of the soft spring should be smaller than each energy harvesting element (or EH functional beam). In various embodiments, the soft spring may be fabricated simultaneously with the functional beams on or using the same layer.

It should be appreciated that while the descriptions contained herein may be provided in the context of energy harvesting using piezoelectric techniques, the mechanism and structures of the energy harvesting devices of various embodiments may be used in other types of EH, such as, for example, based on electrostatic or electromagnetic techniques.

FIG. 1A shows schematic top and cross-sectional views of an energy harvesting device 100, according to various embodiments. The energy harvesting device 100 includes a plurality of energy harvesting elements 102a, 102b, each energy harvesting element 102a, 102b including a transducer 112a, 112b, and at least one spring 106 arranged in between at least two energy harvesting elements 102a, 102b of the plurality of energy harvesting elements 102a, 102b to mechanically couple the at least two energy harvesting elements 102a, 102b to each other.

In other words, an energy harvesting device 100 may be provided, having a plurality (or array) of energy harvesting elements 102a, 102b. This may mean that at least two (i.e., two or more) energy harvesting elements 102a, 102b may be provided for the energy harvesting device 100. For example, the energy harvesting device 100 may include a first energy harvesting element 102a and a second energy harvesting element 102b.

Each energy harvesting element 102a, 102b may include a transducer 112a, 112b. For example, the first energy harvesting element 102a may include an associated first transducer 112a, while the second energy harvesting element 102b may include an associated second transducer 112*b*. Each energy harvesting element 102*a*, 102*b* may be capable of converting one form of energy (e.g., kinetic energy) into another form of energy (e.g., electrical energy), via the transducer 112*a*, 112*b*. In the context of various embodiments, the term "transducer" may mean an energy converter, for example, for converting between kinetic energy and electrical energy.

The energy harvesting device 100 may further include at least one spring 106 arranged in between two energy harvesting elements 102*a*, 102*b* of the plurality of energy harvesting elements 102*a*, 102*b* to mechanically couple the at least two energy harvesting elements 102*a*, 102*b* to each other. This may mean that the energy harvesting elements 102*a*, 102*b* may be mechanically coupled to each other.

It should be appreciated while two energy harvesting elements 102*a*, 102*b* are shown and described in the context of the energy harvesting device 100, it should be appreciated that any higher number of energy harvesting elements 102*a*, 102*b* may be employed for the energy harvesting device 100, with the associated transducers and springs.

In various embodiments, the spring 106 arranged in between at least two energy harvesting elements 102*a*, 102*b* may enable broadband energy harvesting. For example, the spring 106 may couple at least two energy harvesting elements 102*a*, 102*b* to each other such that the energy harvesting elements 102*a*, 102*b* may move (e.g., vibrate) in a concerted manner or a dependent manner relative to each other. As non-limiting examples, the spring 106 may allow an energy harvesting element (e.g., 102*a*) to exhibit enhanced vibration as a result of vibration of the other energy harvesting element (e.g., 102*b*), and vice versa, due to coupling between the energy harvesting elements 102*a*, 102*b*, via the spring 106. Where the spring 106 may be absent, the energy harvesting elements 102*a*, 102*b* may be decoupled from each other such that the energy harvesting elements 102*a*, 102*b* may independently vibrate, where the energy harvesting elements 102*a*, 102*b* may not cooperate with each other to provide enhanced vibration. Further, where the spring 106 may be absent, the energy harvesting elements 102*a*, 102*b* may vibrate in opposite directions in a way that may reduce the energy harvesting efficiency of the energy harvesting device.

In various embodiments, a spring constant of the at least one spring 106 may be less than a spring constant of each energy harvesting element 102*a*, 102*b* of the plurality of energy harvesting elements 102*a*, 102*b*. As a non-limiting example, a spring constant of the spring 106 may be less than a spring constant of the carrier of each energy harvesting element 102*a*, 102*b*.

In various embodiments, the at least one spring may be arranged in between adjacent (e.g., directly or immediately adjacent) two energy harvesting elements 102*a*, 102*b* of the plurality of energy harvesting elements 102*a*, 102*b* to mechanically couple the adjacent two energy harvesting elements 102*a*, 102*b* to each other. This may mean that adjacent two energy harvesting elements 102*a*, 102*b* to each other may be mechanically coupled to each other.

In various embodiments, at least some of the plurality of energy harvesting elements 102*a*, 102*b* may be arranged in parallel. This may mean that some energy harvesting elements 102*a*, 102*b* may be arranged at least substantially parallel to each other, and/or some energy harvesting elements 102*a*, 102*b* may be arranged in a parallel coupling arrangement.

In various embodiments, the plurality of energy harvesting elements 102*a*, 102*b* may be arranged spaced apart from each other. This may mean that the energy harvesting elements 102*a*, 102*b* of the plurality of energy harvesting elements 102*a*, 102*b* may be arranged with a spacing or gap in between.

In various embodiments, at least one energy harvesting element of the plurality of energy harvesting elements 102*a*, 102*b* may be arranged along a first direction, and wherein at least one other energy harvesting element of the plurality of energy harvesting elements 102*a*, 102*b* may be arranged along a second direction different from the first direction. The first direction and the second direction may be at least substantially orthogonal or perpendicular to each other.

In various embodiments, each energy harvesting element 102*a*, 102*b* of the plurality of energy harvesting elements 102*a*, 102*b* may further include at least one proof mass 104*a*, 104*b*. As a non-limiting example, the energy harvesting element 102*a* may include a proof mass 104*a*, while the energy harvesting element 102*b* may include a proof mass 104*b*. In the context of various embodiments, a "proof mass" may mean a predetermined mass which may serve as a reference mass for setting or changing a resonant frequency of the energy harvesting element.

In various embodiments, the at least one spring 106 may be coupled to the respective regions of the energy harvesting elements 102*a*, 102*b* where the proof masses 104*a*, 104*b* may be arranged, so as to couple the energy harvesting elements 102*a*, 102*b* to each other. In this way, the at least one spring 106 may couple the proof masses 104*a*, 104*b* to each other.

In various embodiments, the proof masses 104*a*, 104*b* and the spring 106 arranged in between the proof masses 104*a*, 104*b* may cooperate to enable broadband energy harvesting. For example, the spring 106 may couple the energy harvesting elements 102*a*, 102*b* to each other and/or may couple the proof masses 104*a*, 104*b* to each other such that the energy harvesting elements 102*a*, 102*b* and/or the proof masses 104*a*, 104*b* may move (e.g., vibrate) in a concerted manner or a dependent manner relative to each other. As non-limiting examples, the spring 106, with the coupled proof masses 104*a*, 104*b*, may allow an energy harvesting element (e.g., 102*a*) to exhibit enhanced vibration as a result of vibration of the other energy harvesting element (e.g., 102*b*), and vice versa, due to coupling between the energy harvesting elements 102*a*, 102*b*, via the spring 106. Where the spring 106 may be absent, the energy harvesting elements 102*a*, 102*b* may be decoupled from each other such that the energy harvesting elements 102*a*, 102*b* may independently vibrate, where the energy harvesting elements 102*a*, 102*b* may not cooperate with each other to provide enhanced vibration. Further, where the spring 106 may be absent, the energy harvesting elements 102*a*, 102*b* may vibrate in opposite directions in a way that may reduce the energy harvesting efficiency of the energy harvesting device.

In various embodiments, the at least one proof mass 104*a*, 104*b* may be arranged at an end portion of the energy harvesting element 102*a*, 102*b*, or at a central portion of the energy harvesting element 102*a*, 102*b*.

In various embodiments, each energy harvesting element 102*a*, 102*b* of the plurality of energy harvesting elements 102*a*, 102*b* may further include two proof masses arranged on opposite end portions of the energy harvesting element 102*a*, 102*b*.

In various embodiments, the plurality of energy harvesting elements 102*a*, 102*b* may have respective resonant frequencies different from each other. This may mean that each energy harvesting element 102*a*, 102*b* may have a respective resonant frequency that may be different from that of another energy harvesting element 102*a*, 102*b*. As non-limiting examples, the difference in resonant frequencies may be due to a difference in at least one dimension (e.g., width and/or height (thickness) and/or length) of an energy harvesting element (e.g., 102a) relative to another (e.g., 102b), and/or due to a difference in at least one dimension (e.g., width and/or height (thickness) and/or length) of a proof mass (e.g., 104a) relative to another proof mass (e.g., 104b).

In various embodiments, each energy harvesting element 102a, 102b of the plurality of energy harvesting elements 102a, 102b may be configured to vibrate in response to kinetic energy acting on the energy harvesting device 100, and/or acting on the energy harvesting element 102a, 102b. In this way, for example, the kinetic energy may be converted into electrical energy as a result of vibration of the energy harvesting element 102a, 102b having the associated transducer 112a, 112b. The kinetic energy, for example, may be in the form of mechanical motion, and may include vibration or vibration energy. The kinetic energy may be due to human motion, for example, walking, running, etc.

In various embodiments, the transducer 112a, 112b may include at least one of a piezoelectric transducer, an electrostatic transducer or an electromagnetic transducer.

FIG. 1A shows a cross-sectional view of the energy harvesting device 100, taken along line A-A', illustrating an example of the energy harvesting device 100 having a piezoelectric transducer. In various embodiments, the piezoelectric transducer 112a may include a pair of electrodes, for example, a first electrode 116a and a second electrode 118a, and a piezoelectric structure 114a arranged in between the first electrode 116a and the second electrode 118a. The first electrode 116a may be a top (upper) electrode while the second electrode 118a may be a bottom (lower) electrode.

As non-limiting examples, the piezoelectric structure 114a may include at least one of a piezoelectric film, a piezoelectric layer, or an arrangement (or laminate) of piezoelectric layers. In the context of various embodiments, the piezoelectric structure 114a may include at least one of aluminum nitride (AlN), zinc oxide (ZnO), lithium niobate (LiNbO$_3$), or lead zirconium titanate (PZT). However, it should be appreciated that other piezoelectric materials may also be employed.

In various embodiments, the first electrode 116a may include a plurality of electrode portions electrically isolated from each other.

In various embodiments, an electrostatic transducer may include, for example, two parallel electrodes spaced apart from each other, where at least one electrode may be movable relative to the other electrode. The two parallel electrodes may act as a capacitive element. A DC voltage may be applied to the two electrodes. During operation, as the energy harvesting element, e.g., 102a, moves, the distance between the two parallel electrodes may change, and electrical charges may accumulate on the electrodes such that an electrical energy may be derived therefrom.

In various embodiments, an electromagnetic transducer may include, for example, a (one) conductor and a magnetic element (which may generate a magnetic field) arranged spaced apart from each other, where at least one of the conductor or the magnetic element may be movable relative to the other. During operation, as the energy harvesting element, e.g., 102a, moves, a relative motion may be created which may cause the conductor to cut (or interrupt) or move into or move through the magnetic field lines of the magnetic field generated by the magnetic element. This may cause or develop a potential difference between the terminals or electrodes of the conductor such that an electrical energy may be derived therefrom.

In the context of various embodiments, each energy harvesting element 102a, 102b may be in the form of a beam.

In various embodiments, each energy harvesting element 102a, 102b of the plurality of energy harvesting elements 102a, 102b may include a cantilever beam or a double clamped beam (e.g., a clamped-clamped beam).

In various embodiments, the energy harvesting device 100 may further include a support structure, wherein at least one end of each energy harvesting element 102a, 102b of the plurality of energy harvesting elements 102a, 102b may be coupled (e.g., clamped or fixed) to the support structure. As an example, one end of each energy harvesting element 102a, 102b may be coupled to the support structure, while an opposite end of each energy harvesting element 102a, 102b may be a free end. In this way, each energy harvesting element 102a, 102b may be a cantilever beam. In various embodiments, the at least one end of each energy harvesting element 102a, 102b may be rigidly fixed to the support structure such that the at least one end of each energy harvesting element 102a, 102b may be non-movable relative to the support structure.

In various embodiments, opposite ends of each energy harvesting element 102a, 102b may be coupled (e.g., clamped or fixed) to the support structure. In this way, each energy harvesting element 102a, 102b may be a double clamped beam. In various embodiments, opposite ends of each energy harvesting element 102a, 102b may be rigidly fixed to the support structure such that opposite ends of each energy harvesting element 102a, 102b may be non-movable relative to the support structure.

In various embodiments, the energy harvesting device 100 may further include a support structure, wherein respective central portions of some of the plurality of energy harvesting elements 102a, 102b may be coupled (e.g., clamped or fixed) to the support structure. In various embodiments, respective central portions of some of the plurality of energy harvesting elements 102a, 102b may be rigidly fixed to the support structure such that the respective central portions of some of the plurality of energy harvesting elements 102a, 102b may be non-movable relative to the support structure. In various embodiments, the plurality of energy harvesting elements 102a, 102b may be coupled to each other at their respective central portions.

In various embodiments, the support structure may be in the form of a frame structure.

In various embodiments, the at least one spring 106 may have or consist of a linear structure, for example, as illustrated in FIG. 1A. In various embodiments, the at least one spring 106 may have a quadrilateral structure. As non-limiting examples, the quadrilateral structure of the at least one spring 106 may include a rectangular structure or a square structure. In various embodiments, the at least one spring 106 may have a folded structure having at least two parallel segments.

In various embodiments, each energy harvesting element 102a, 102b of the plurality of energy harvesting elements 102a, 102b may include a tapering structure, for example, where its width decreases in one direction. For example, each energy harvesting element 102a, 102b may have a tapering structure in a direction towards its respective proof mass 104a, 104b, where the width decreases in the direction towards its respective proof mass 104a, 104b.

In various embodiments, each proof mass 104a, 104b may have a quadrilateral structure, e.g., having a cross-sectional shape of a rectangle or a square. In various embodiments, each proof mass 104a, 104b may be a block structure.

In various embodiments, each energy harvesting element 102a, 102b may include a carrier 120a, 120b or a substrate 120a, 120b. In various embodiments, the carrier 120a, 120b of each energy harvesting element 102a, 102b may be an extension of the support structure. In various embodiments, the electrostatic transducer, the electromagnetic transducer, or the piezoelectric transducer may be disposed on or coupled to the carrier 120a, 120b.

In various embodiments, the at least one spring 106 may be formed between the respective carriers 120a, 120b of the energy harvesting elements 102a, 102b. The at least one spring 106 may be coupled to the respective carriers 120a, 120b of the energy harvesting elements 102a, 102b. The respective carriers 120a, 120b of the energy harvesting elements 102a, 102b, and the at least one spring 106 formed between the respective carriers 120a, 120b may be formed of or on the same layer.

In the context of various embodiments, based on or depending on the desired applications and/or desired operation frequency range, the dimensions (e.g., at least one of a height (or thickness), width, or length) of the proof mass 104a, 104b, and/or the dimensions (e.g., at least one of a height (or thickness), width, or length) of the energy harvesting element 102a, 102b may be any values from nanometer (nm) to meters (m), for example, in the range between about 1 nm and about 5 m, between about 1 nm and about 1 m, between about 1 nm and about 1 cm, between about 1 nm and about 1 mm, between about 1 nm and about 1 between about 1 µm and about 5 m, between about 1 cm and about 5 m, or between about 1 nm and about 500 nm. Nevertheless, it should be appreciated that any value within the ranges specified above, or outside of the ranges specified above, may be used, depending on the design and/or application and/or operation frequency range.

In the context of various embodiments, for example, for a MEMS energy harvesting device, each proof mass 104a, 104b may have a height (or thickness) of about tens of µm to about 1 mm, for example, between about 10 µm and about 1 mm (or 1000 µm), between about 10 µm and about 500 µm, between about 10 µm and about 100 µm, between about 10 µm and about 50 µm, between about 100 µm and about 1000 µm, or between about 100 µm and about 500 µm.

In the context of various embodiments, for example, for a MEMS energy harvesting device, each proof mass 104a, 104b may have a width of about tens of µm to tens of mm, for example, between about 10 µm and about 90 mm (or 90000 µm), for example, between about 10 µm and about 50000 µm, between about 10 µm and about 10000 µm, between about 10 µm and about 5000 µm, between about 10 µm and about 1000 µm, between about 10 µm and about 500 µm, between about 100 µm and about 50000 µm, or between about 1000 µm and about 50000 µm.

In the context of various embodiments, for example, for a MEMS energy harvesting device, each proof mass 104a, 104b may have a length of about tens of µm to tens of mm, for example, between about 10 µm and about 90 mm (or 90000 µm), for example, between about 10 µm and about 50000 µm, between about 10 µm and about 10000 µm, between about 10 µm and about 5000 µm, between about 10 µm and about 1000 µm, between about 10 µm and about 500 µm, between about 100 µm and about 50000 µm, or between about 1000 µm and about 50000 µm.

In the context of various embodiments, for example, for a MEMS energy harvesting device, each energy harvesting element 102a, 102b may have a height (or thickness) of about 1 µm to tens of µm, for example, between about 1 µm and about 90 µm, between about 1 µm and about 50 µm, between about 1 µm and about 10 µm, between about 1 µm and about 5 µm, between about 10 µm and about 90 µm, between about 10 µm and about 50 µm, or between about 10 µm and about 30 µm.

In the context of various embodiments, for example, for a MEMS energy harvesting device, each energy harvesting element 102a, 102b may have a width of about tens of µm to tens of mm, for example, between about 10 µm and about 90 mm (or 90000 µm), for example, between about 10 µm and about 50000 µm, between about 10 µm and about 10000 µm, between about 10 µm and about 5000 µm, between about 10 µm and about 1000 µm, between about 10 µm and about 500 µm, between about 100 µm and about 50000 µm, or between about 1000 µm and about 50000 µm.

In the context of various embodiments, for example, for a MEMS energy harvesting device, each energy harvesting element 102a, 102b may have a length of about tens of µm to tens of mm, for example, between about 10 µm and about 90 mm (or 90000 µm), for example, between about 10 µm and about 50000 µm, between about 10 µm and about 10000 µm, between about 10 µm and about 5000 µm, between about 10 µm and about 1000 µm, between about 10 µm and about 500 µm, between about 100 µm and about 50000 µm, or between about 1000 µm and about 50000 µm.

In the context of various embodiments, the energy harvesting device 100 may be employed for harvesting ambient vibration energy.

It should be appreciated that the cross-sectional view shown in FIG. 1A relating to the energy harvesting element 102a and the associated descriptions may correspondingly be applicable to the energy harvesting element 102b, or any energy harvesting element of the plurality of energy harvesting elements.

It should be appreciated that while the transducers 112a, 112b, and the proof masses 104a, 104b are shown provided on opposite surfaces of the respective carriers 120a, 120b, the transducers 112a, 112b, and the proof masses 104a, 104b may be provided on the same surface of the respective carriers 120a, 120b.

It should be appreciated that for each piezoelectric transducer, the piezoelectric structure (e.g., 114a) and the second electrode (e.g., bottom electrode) (e.g., 118a) may be provided on the entire surface of the respective carriers (e.g., 120a, 120b). The first electrode (e.g., top electrode) (e.g., 116a) may be provided on a partial portion of the respective piezoelectric structure, and therefore also on a partial portion of the surface of the respective carrier. The dimension of the top electrode and/or its position on the piezoelectric structure may be optimized to enhance the electrical potential between the top and bottom electrodes. For example, the top electrode may be provided towards the end portion of the respective energy harvesting element away from the associated proof mass.

Figure 1B:
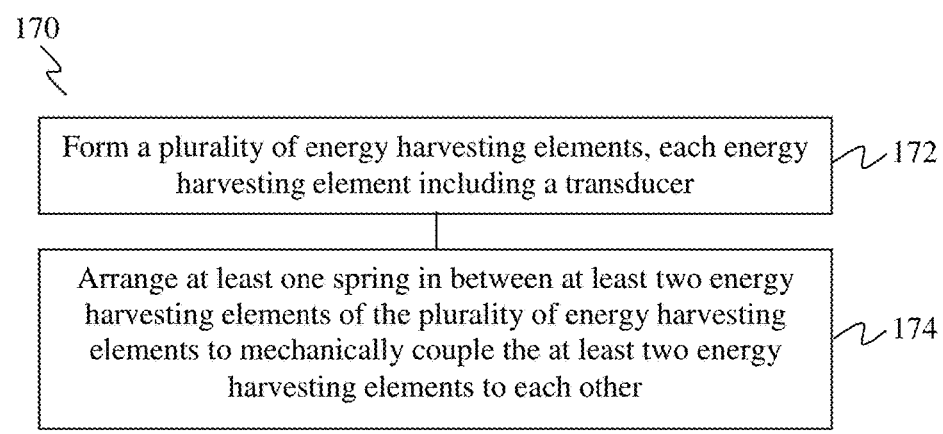
FIG. 1B shows a flow chart illustrating a method for forming an energy harvesting device, according to various embodiments.

FIG. 1B shows a flow chart 170 illustrating a method for forming an energy harvesting device, according to various embodiments.

At 172, a plurality of energy harvesting elements are formed, each energy harvesting element including a transducer.

At 174, at least one spring is arranged in between at least two energy harvesting elements of the plurality of energy harvesting elements to mechanically couple the at least two energy harvesting elements to each other.

In various embodiments, a spring constant of the at least one spring may be less than a spring constant of each energy harvesting element of the plurality of energy harvesting elements.

In various embodiments, each energy harvesting element of the plurality of energy harvesting elements may further include at least one proof mass.

It should be appreciated that descriptions in the context of the energy harvesting device 100 may correspondingly be applicable in relation to the method for forming an energy harvesting device.

FIGS. 2A to 2F show schematic perspective views of respective energy harvesting devices, according to various embodiments. The respective energy harvesting devices 250a, 250b, 250c, 250d, 250e, 250f may have a configuration of a single energy harvesting element with multi-proof mass.

Figure 2A:
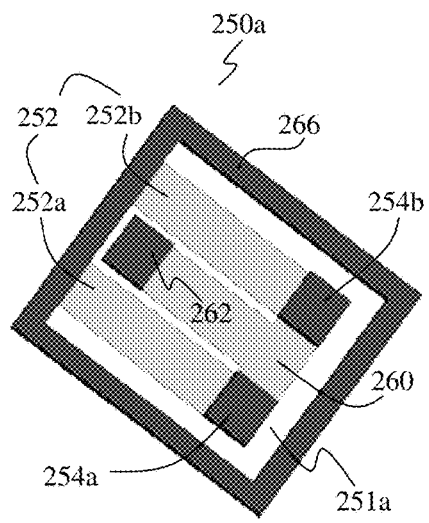
FIGS. 2A to 2F show schematic perspective views of respective energy harvesting devices, according to various embodiments.

Referring to FIG. 2A, the energy harvesting device 250a may include an energy harvesting element 251a having a main beam 252 including a first main beam portion 252a and a second main beam portion 252b. The first main beam portion 252a may have a proof mass 254a towards one end or end region of the first main beam portion 252a, while the second main beam portion 252b may have a proof mass 254b towards one end or end region of the second main beam portion 252b. The first main beam portion 252a and a second main beam portion 252b may act as cantilever beams or suspended flexural beams. The energy harvesting element 251a may further include an additional beam (e.g., a cantilever beam or a suspended flexural beam) 260 with a proof mass 262 towards one end or end region of the additional beam 260. An opposite end of the additional beam 260 may be coupled to the respective ends of the first main beam portion 252a and the second main beam portion 252b having the proof masses 254a, 254b. The proof masses 254a, 254b, 262 may include silicon (Si). The energy harvesting device 250a may include a support structure (e.g., a frame structure) 266 where the first main beam portion 252a and the second main beam portion 252b may be coupled (e.g., rigidly fixed) to, at their respective ends opposite to the ends having the proof masses 254a, 254b. The support structure 266 may include silicon (Si).

Figure 2B:
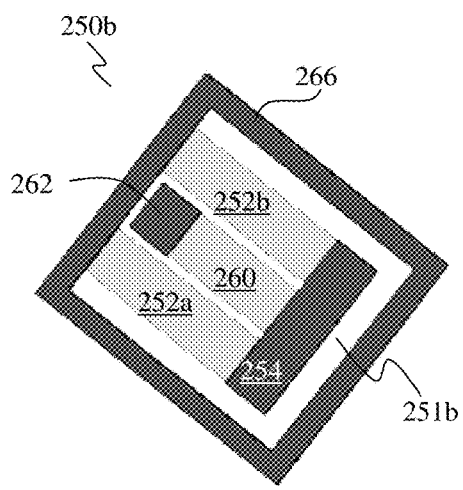

Referring to FIG. 2B, the energy harvesting device 250b may include an energy harvesting element 251b having a similar configuration as the energy harvesting element 251a (FIG. 2A), except that the energy harvesting device 250b has a proof mass 254 arranged across the first main beam portion 252a, the second main beam portion 252b and the additional beam 260.

Figure 2C:
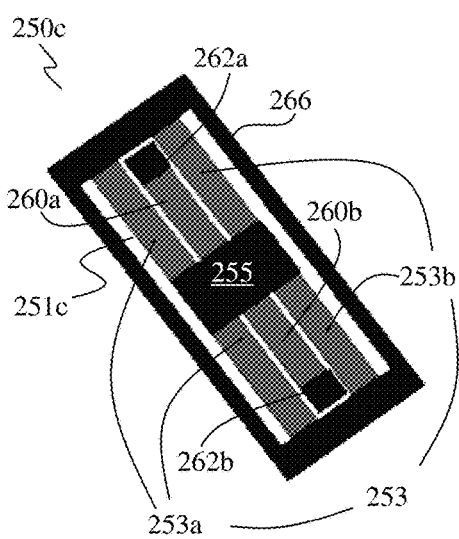

Referring to FIG. 2C, the energy harvesting device 250c may include an energy harvesting element 251c having a main beam 253 including a first main beam portion 253a and a second main beam portion 253b. The energy harvesting element 251c may include a proof mass 255 arranged at a central portion or region of the first main beam portion 253a and the second main beam portion 253b. Opposite ends of the first main beam portion 253a and the second main beam portion 253b may be coupled (e.g., rigidly fixed) to a support structure (e.g., a frame structure) 266. The energy harvesting element 251c may further include a first additional beam (e.g., a cantilever beam or a suspended flexural beam) 260a with a proof mass 262a towards one end or end region, with the opposite end of the first additional beam 260a coupled to the central proof mass 255. The energy harvesting element 251c may further include a second additional beam (e.g., a cantilever beam or a suspended flexural beam) 260b with a proof mass 262b towards one end or end region, with the opposite end of the second additional beam 260b coupled to the central proof mass 255.

Figure 2D:
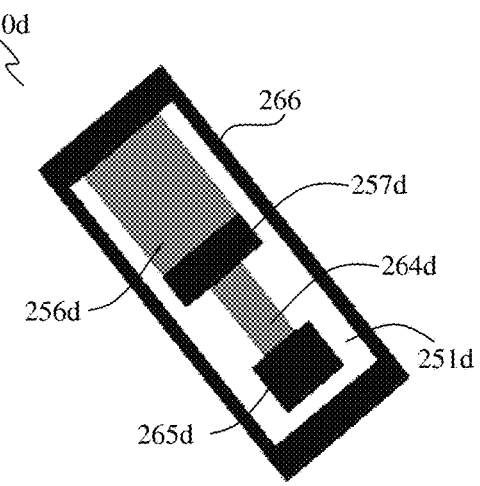

Referring to FIG. 2D, the energy harvesting device 250d may include an energy harvesting element 251d having a main beam 256d with a proof mass 257d arranged towards one end or end region of the main beam 256d. An opposite end of the main beam 256d may be coupled (e.g., rigidly fixed) to a support structure (e.g., a frame structure) 266. The energy harvesting element 251d may further include an additional beam 264d with a proof mass 265d arranged towards one end or end region of the additional beam 264d. An opposite end of the additional beam 264d may be coupled to the main beam 256d, for example, at the end of the main beam 256d having the proof mass 257d. In this way, the additional beam 264d may extend from the main beam 256d, away from the main beam 256d. Each of the main beam 256d and the additional beam 264d may be a cantilever beam or a suspended flexural beam.

Figure 2E:
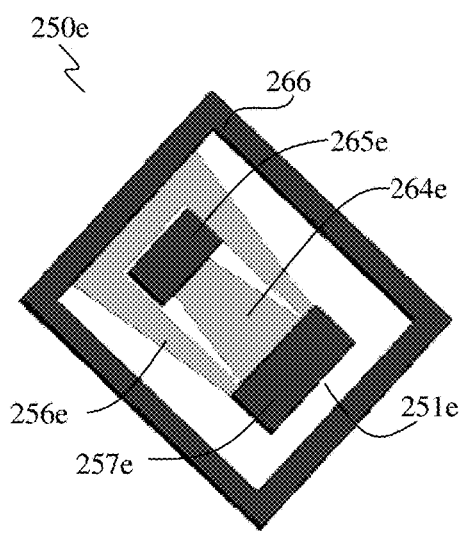

Referring to FIG. 2E, the energy harvesting device 250e may include an energy harvesting element 251e having a main beam 256e with a proof mass 257e arranged towards one end or end region of the main beam 256e. An opposite end of the main beam 256d may be coupled (e.g., rigidly fixed) to a support structure (e.g., a frame structure) 266. The energy harvesting element 251e may further include an additional beam 264e with a proof mass 265e arranged towards one end or end region of the additional beam 264e. An opposite end of the additional beam 264e may be coupled to the main beam 256e, for example, at the end of the main beam 256e having the proof mass 257e. In this way, the additional beam 264e may extend from the main beam 256e, into the main beam 256d. Each of the main beam 256e and the additional beam 264e may be a cantilever beam or a suspended flexural beam.

Figure 2F:
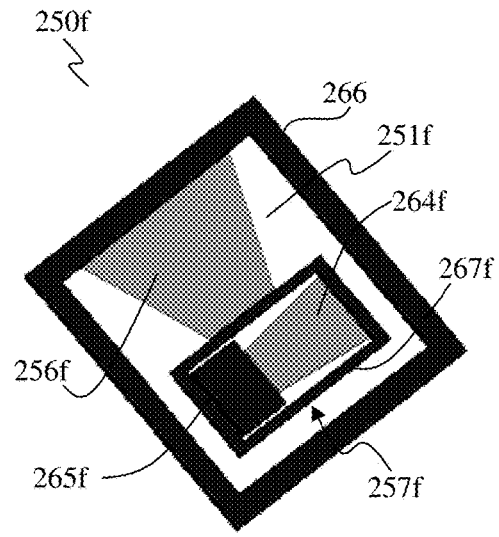

Referring to FIG. 2F, the energy harvesting device 250f may include an energy harvesting element 251f having a main beam 256f with a proof mass 257f arranged towards one end or end region of the main beam 256f. An opposite end of the main beam 256f may be coupled (e.g., rigidly fixed) to a support structure (e.g., a frame structure) 266. The proof mass 257f may be defined by an additional beam 264f with a proof mass 265f arranged towards one end or end region of the additional beam 264f, with the opposite end of the additional beam 264f coupled to another support structure 267f. In this way, the additional beam 264f and its associated proof mass 265f may be arranged in or as the proof mass 257f associated with the main beam 256f. Each of the main beam 256f and the additional beam 264f may be a cantilever beam or a suspended flexural beam.

Referring to FIGS. 2A to 2F with regard to the energy harvesting devices 250a, 250b, 250c, 250d, 250e, 250f, the main beam with its associated proof mass may define the basic or fundamental resonant frequency of the whole energy harvesting device, while the additional beam(s) (e.g., additional cantilever beam(s)) with the associated end proof mass may have or define another resonant frequency which may be close to the basic resonant frequency. In various embodiments, the resonance frequency of the main beam may be different from that of the additional beam(s).

As described above, the energy harvesting element may generally be a cantilever beam with an end proof mass or multi suspended flexural piezo-on-silicon beams with a central proof mass configuration. The energy harvesting element may include an additional cantilever beam with an end proof mass. The additional cantilever beam and its end mass may be in the main beam (e.g., FIG. 2E), or out of the main beam (e.g., FIG. 2D) or in the main beam end mass (e.g., FIG. 2F). In various embodiments, the cantilever beam(s), for example, which define the main beam and/or the additional beam may have a rectangular shape, a triangular shape, a ring shape or any other shapes.

The energy harvesting element as described in the context of the energy harvesting devices 250a, 250b, 250c, 250d, 250e, 250f may include a transducer for harvesting energy, e.g., harvesting ambient vibration energy. In various embodiments, each of the main beam and the additional beam may include a transducer.

The proof masses as described in the context of the energy harvesting devices 250a, 250b, 250c, 250d, 250e, 250f may include silicon (Si).

The support structure 266, 267f as described in the context of the energy harvesting devices 250a, 250b, 250c, 250d, 250e, 250f may include silicon (Si).

It should be appreciated that the structure, including the piezoelectric transducer, of any one of the beams 252a, 252b, 253a, 253b, 256d, 256e, 256f, 260, 260a, 260b, 264d, 264e, 264f of the energy harvesting device 250a, 250b, 250c, 250d, 250e, 250f may be as correspondingly described below in the context of the energy harvesting element 302a illustrated in FIG. 3F.

FIGS. 3A to 3G show schematic perspective and cross-sectional views of respective energy harvesting devices, according to various embodiments. The respective energy harvesting devices 300a, 300b, 300c, 300d, 300e, 300g, 300h may have a configuration of 1D (one-dimensional) or 2D (two-dimensional) energy harvesting element array which may be mechanically connected with soft springs. For example, the energy harvesting element array may be mechanically connected through the proof masses with soft springs.

Figure 3A:
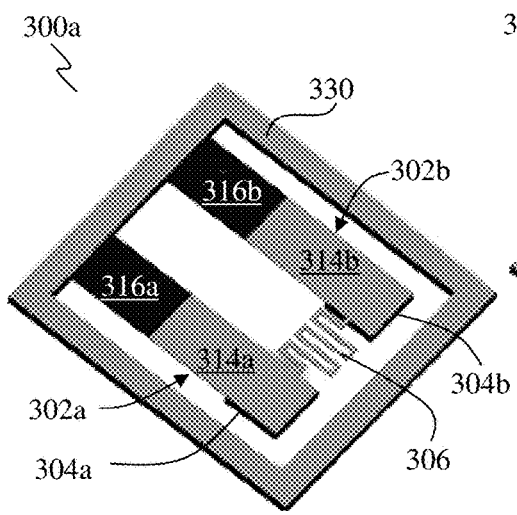
FIGS. 3A to 3E show schematic perspective views of respective energy harvesting devices, according to various embodiments.

Referring to FIG. 3A, the energy harvesting device 300a may include a plurality of energy harvesting elements, for example a first energy harvesting element 302a and a second energy harvesting element 302b, which may be arranged spaced apart from each other. The energy harvesting device 300a may further include a plurality of proof masses. For example, a first proof mass 304a may be arranged towards one end or end region of the first energy harvesting element 302a, while a second proof mass 304b may be arranged towards one end or end region of the second energy harvesting element 302b. The opposite end of each of the first energy harvesting element 302a and the second energy harvesting element 302b may be coupled (e.g., rigidly fixed) to a support structure (e.g., a frame structure) 330. Each of the first energy harvesting element 302a and the second energy harvesting element 302b may be or may act as a cantilever beam. The energy harvesting device 300a may further include a spring (or soft spring) 306 for mechanically coupling the first energy harvesting element 302a and the second energy harvesting element 302b (e.g., adjacent or directly adjacent energy harvesting elements) to each other. The spring 306 may be coupled to the respective regions of the energy harvesting elements 302a, 302b where the proof masses 304a, 304b may be arranged, so as to mechanically couple the energy harvesting elements 302a, 302b to each other. In this way, the spring 306 may couple the proof masses 304a, 304b to each other. The spring 306 may have a folded structure having at least two parallel segments, as shown in FIG. 3A. The parallel segments may be at least substantially aligned along a longitudinal axis (for example parallel to the longitudinal axis) of at least one of the first energy harvesting element 302a or the second energy harvesting element 302b. However, it should be appreciated that the spring 306 may have a quadrilateral structure as described below in the context of the spring 307a, 307b, 309a, 309b.

Figure 3B:
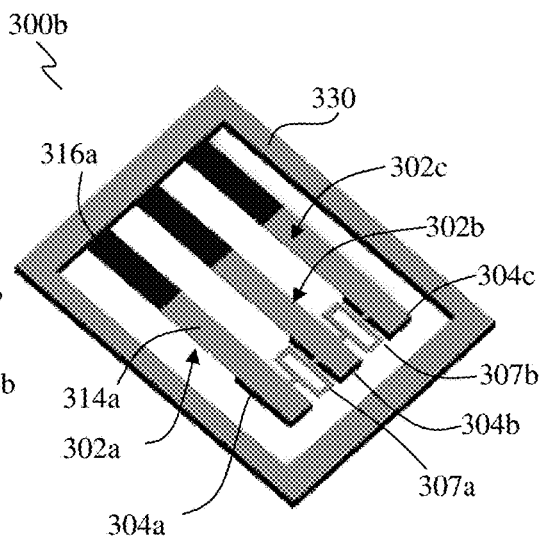
Figure 3C:
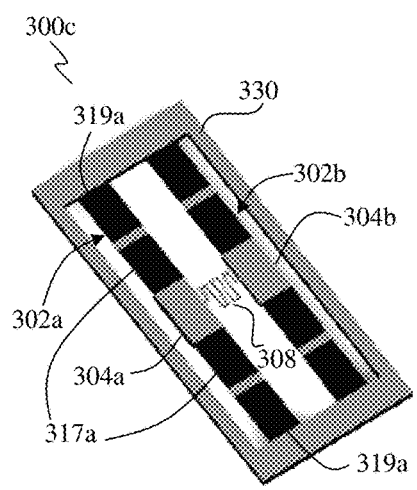
Figure 3D:
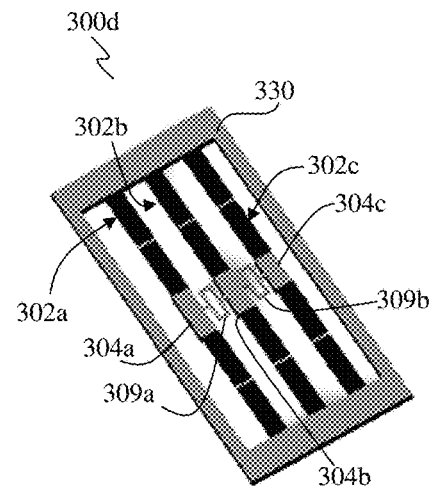
Figure 3E:
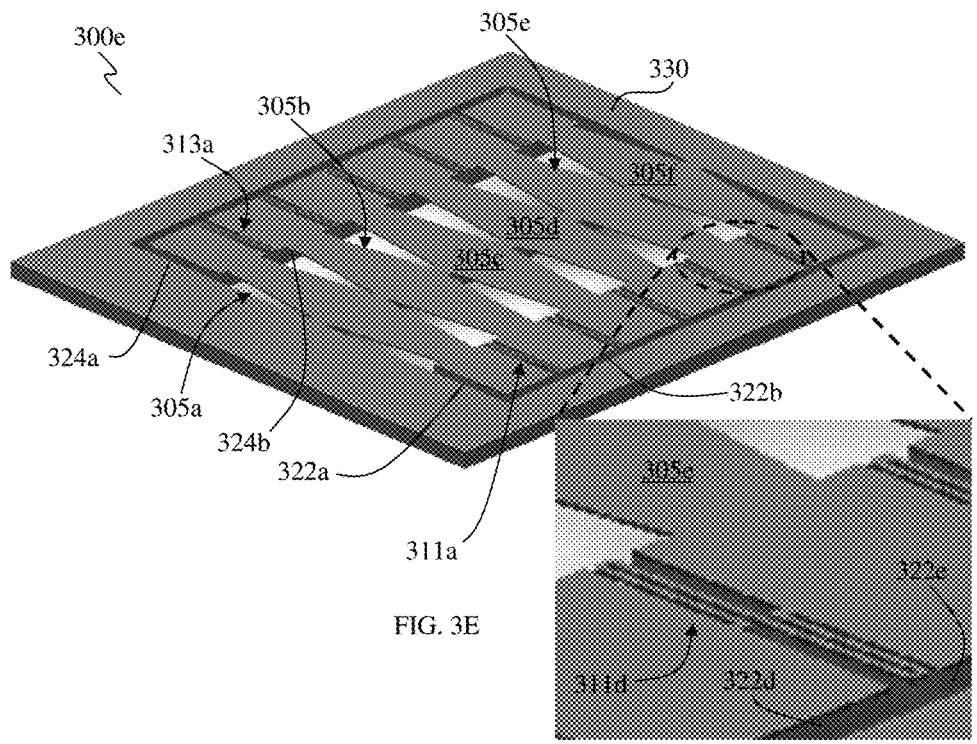
Figure 3F:
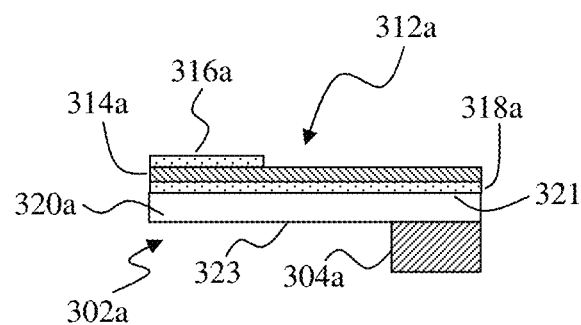
FIG. 3F shows a schematic cross-sectional view of an energy harvesting element of an energy harvesting device, according to various embodiments.

Referring to FIG. 3A, and FIG. 3F which illustrates a schematic cross-sectional view of an energy harvesting element of an energy harvesting device, and using a piezoelectric transducer as an example, as well as the energy harvesting element 302a as an example, the energy harvesting element 302a may include a carrier 320a and a piezoelectric transducer 312a arranged on the carrier 320a. The piezoelectric transducer 312a may be arranged on an upper surface 321 of the carrier 320a while the proof mass 304a may be arranged on a lower surface 323 of the carrier 320a. The proof mass 304a may be arranged towards one end portion of the carrier 320a or of the energy harvesting element 302a. The piezoelectric transducer 312a may include a bottom electrode 318a and a piezoelectric structure 314a arranged on the entire upper surface 321 of the carrier 320a. The piezoelectric transducer 312a may further include a top electrode 316a (dark-coloured portion of the energy harvesting element 302a shown in FIG. 3A) arranged on a partial portion of the piezoelectric structure 314a. This may mean that the top electrode 316a may overlap with a partial portion of the carrier 320a. The top electrode 316a may be arranged towards the end portion of the carrier 320a or of the energy harvesting element 302a opposite to the end portion with the proof mass 304a. Electrical interconnections may be electrically coupled between the top electrode 316a and the bottom electrode 318a. Correspondingly, the energy harvesting element 302b may include a carrier and a piezoelectric transducer arranged on the carrier, where the piezoelectric transducer may include a bottom electrode, a piezoelectric structure 314b and a top electrode 316b (dark-coloured portion of the energy harvesting element 302b shown in FIG. 3A), which may be as described in the context of the energy harvesting element 302a, with reference to FIG. 3F.

Referring to FIG. 3B, the energy harvesting device 300b may include a plurality of energy harvesting elements, for example a first energy harvesting element 302a, a second energy harvesting element 302b, and a third energy harvesting element 302c, which may be arranged spaced apart from each other. The energy harvesting device 300b may further include a plurality of proof masses. For example, a first proof mass 304a may be arranged towards one end or end region of the first energy harvesting element 302a, a second proof mass 304b may be arranged towards one end or end region of the second energy harvesting element 302b, while a third proof mass 304c may be arranged towards one end or end region of the third energy harvesting element 302c. The opposite end of each of the first energy harvesting element 302a, the second energy harvesting element 302b and the third energy harvesting element 302c may be coupled (e.g., rigidly fixed) to a support structure (e.g., a frame structure) 330. Each of the first energy harvesting element 302a, the second energy harvesting element 302b and the third energy harvesting element 302c may be or may act as a cantilever beam.

The energy harvesting device 300a may further include a plurality of springs (or soft springs). For example, the energy harvesting device 300a may include a first spring 307a for mechanically coupling or connecting the first energy harvesting element 302a and the second energy harvesting element 302b (e.g., adjacent or directly adjacent energy harvesting elements) to each other. The first spring 307a may be coupled to the respective regions of the energy harvesting elements 302a, 302b where the proof masses 304a, 304b may be arranged, so as to mechanically couple the energy harvesting elements 302a, 302b to each other. In this way, the first spring 307a may couple the proof masses 304a, 304b to each other. The energy harvesting device 300a may include a second spring 307b for mechanically coupling or connecting the second energy harvesting element 302b and the third energy harvesting element 302c (e.g., adjacent or directly adjacent energy harvesting elements) to each other. The second spring 307b may be coupled to the respective regions of the energy harvesting elements 302b, 302c where the proof masses 304b, 304c may be arranged, so as to mechanically couple the energy harvesting elements 302b, 302c to each other. In this way, the second spring 307b may couple the proof masses 304b, 304c to each other.

Each of the first spring 307a and the second spring 307b may have a quadrilateral structure (e.g., a rectangular structure). However, it should be appreciated that each of the first spring 307a and the second spring 307b may have a folded structure as described in the context of the spring 306.

Each of the first energy harvesting element 302a, the second energy harvesting element 302b and the third energy harvesting element 302c of the energy harvesting device 300b may be as described in the context of the energy harvesting element 302a of the energy harvesting device 300a, with reference to FIG. 3F. Using the first energy harvesting element 302a of the energy harvesting device 300b as a non-limiting example, the first energy harvesting element 302a may include a carrier and a piezoelectric transducer arranged on the carrier, where the piezoelectric transducer may include a bottom electrode, a piezoelectric structure 314a and a top electrode 316a (dark-coloured portion of the energy harvesting element 302a shown in FIG. 3B). Electrical interconnections may be electrically coupled between the top electrode 316a and the bottom electrode.

Referring to FIG. 3C, the energy harvesting device 300c may include a plurality of energy harvesting elements, for example a first energy harvesting element 302a and a second energy harvesting element 302b, which may be arranged spaced apart from each other. The energy harvesting device 300c may further include a plurality of proof masses. For example, a first proof mass 304a may be arranged at a central region of the first energy harvesting element 302a, while a second proof mass 304b may be arranged at a central region of the second energy harvesting element 302b. Opposite ends of each of the first energy harvesting element 302a and the second energy harvesting element 302b may be coupled (e.g., rigidly fixed) to a support structure (e.g., a frame structure) 330. In this way, each of the first energy harvesting element 302a and the second energy harvesting element 302b may be a double clamped beam. The energy harvesting device 300c may further include a spring (or soft spring) 308 for mechanically coupling the first energy harvesting element 302a and the second energy harvesting element 302b (e.g., adjacent or directly adjacent energy harvesting elements) to each other. The spring 308 may be coupled to the respective regions of the energy harvesting elements 302a, 302b where the proof masses 304a, 304b may be arranged, so as to mechanically couple the energy harvesting elements 302a, 302b to each other. In this way, the spring 308 may couple the proof masses 304a, 304b to each other. The spring 308 may have a folded structure having at least two parallel segments, as shown in FIG. 3C. The parallel segments may be at least substantially aligned along a longitudinal axis (for example parallel to the longitudinal axis) of at least one of the first energy harvesting element 302a or the second energy harvesting element 302b. However, it should be appreciated that the spring 308 may have a quadrilateral structure as described in the context of the spring 307a, 307b.

Each of the first energy harvesting element 302a and the second energy harvesting element 302b of the energy harvesting device 300c may be as correspondingly described in the context of the energy harvesting element 302a of the energy harvesting device 300a, with reference to FIG. 3F. Using the first energy harvesting element 302a of the energy harvesting device 300c as a non-limiting example, the first energy harvesting element 302a may include a carrier and a piezoelectric transducer arranged on the carrier, where the piezoelectric transducer may include a bottom electrode and a piezoelectric structure arranged on an entire upper surface of the carrier. A proof mass 304a may be arranged on a lower surface of the carrier, towards a central portion of the carrier or of the energy harvesting element 302a. The piezoelectric transducer may further include a top electrode (or top electrode layer) having a plurality of electrode portions. For example, the piezoelectric transducer may include central electrode portions 317a (dark-coloured central portions of the energy harvesting element 302a shown in FIG. 3C) arranged on either side of the proof mass 304a and adjacent to the proof mass 304a, and end electrode portions 319a (dark-coloured end portions of the energy harvesting element 302a shown in FIG. 3C) arranged towards opposite end portions of the energy harvesting element 302a. A central electrode portion 317a and an end electrode portion 319a adjacent (e.g., immediately or directly adjacent) to each other may be electrically isolated from each other. The bottom electrode may be a floating electrode, with respective electrical interconnections electrically coupled between a central electrode portion 317a and an end electrode portion 319a adjacent (e.g., immediately or directly adjacent) to each other. The energy harvesting element 302b may be as correspondingly described in the context of the energy harvesting element 302a.

Referring to FIG. 3D, the energy harvesting device 300d may include a plurality of energy harvesting elements, for example a first energy harvesting element 302a, a second energy harvesting element 302b, and a third energy harvesting element 302c, which may be arranged spaced apart from each other. The energy harvesting device 300d may further include a plurality of proof masses. For example, a first proof mass 304a may be arranged at a central region of the first energy harvesting element 302a, a second proof mass 304b may be arranged at a central region of the second energy harvesting element 302b, while a third proof mass 304c may be arranged at a central region of the third energy harvesting element 302c. Opposite ends of each of the first energy harvesting element 302a, the second energy harvesting element 302b and the third energy harvesting element 302c may be coupled (e.g., rigidly fixed) to a support structure (e.g., a frame structure) 330. In this way, each of the first energy harvesting element 302a, the second energy harvesting element 302b and the third energy harvesting element 302c may be a double clamped beam.

The energy harvesting device 300d may further include a plurality of springs (or soft springs). For example, the energy harvesting device 300d may include a first spring 309a for mechanically coupling the first energy harvesting element 302a and the second energy harvesting element 302b (e.g., adjacent or directly adjacent energy harvesting elements) to each other. The first spring 309a may be coupled to the respective regions of the energy harvesting elements 302a, 302b where the proof masses 304a, 304b may be arranged, so as to mechanically couple the energy harvesting elements 302a, 302b to each other. In this way, the first spring 309a may couple the proof masses 304a, 304b to each other. The energy harvesting device 300d may include a second spring 309b for mechanically coupling the second energy harvesting element 302b and the third energy harvesting element 302c (e.g., adjacent or directly adjacent energy harvesting elements) to each other. The second spring 309b may be coupled to the respective regions of the energy harvesting elements 302b, 302c where the proof masses 304b, 304c may be arranged, so as to mechanically couple the energy harvesting elements 302b, 302c to each other. In this way, the second spring 309b may couple the proof masses 304b, 304c to each other.

Each of the first spring 309a and the second spring 309b may have a quadrilateral structure (e.g., a rectangular structure). However, it should be appreciated that each of the first spring 309a and the second spring 309b may have a folded structure as described in the context of the spring 306, 308.

For the energy harvesting device 300d, the structure, including a piezoelectric transducer, for each of the first energy harvesting element 302a, the second energy harvesting element 302b and the third energy harvesting element 302c may be as correspondingly described in the context of the energy harvesting element 302a of the energy harvesting device 300c.

Referring to FIG. 3E illustrating an example of a 3D (three dimensional) model of a broadband energy harvesting device, the energy harvesting device 300e may include a plurality of energy harvesting elements 305a, 305b, 305c, 305d, 305e, 305f. The plurality of energy harvesting elements 305a, 305b, 305c, 305d, 305e, 305f may be coupled to each other, for example, the plurality of energy harvesting elements 305a, 305b, 305c, 305d, 305e, 305f may be joined to each other at respective central portions of the plurality of energy harvesting elements 305a, 305b, 305c, 305d, 305e, 305f. The plurality of energy harvesting elements 305a, 305b, 305c, 305d, 305e, 305f may be coupled to a support structure (e.g., a frame structure) 330 at respective central portions of the energy harvesting elements 305a, 305f proximate to the support structure 330. The energy harvesting elements 305a, 305f may be the outermost energy harvesting elements. Each energy harvesting element 305a, 305b, 305c, 305d, 305e, 305f may be or may act as a cantilever beam.

The energy harvesting device 300e may further include a plurality of proof masses. Each energy harvesting element 305a, 305b, 305c, 305d, 305e, 305f may have two respective proof masses associated with the respective energy harvesting element 305a, 305b, 305c, 305d, 305e, 305f. Using the energy harvesting element 305a as a non-limiting example, the energy harvesting element 305a may have two associated proof masses 322a, 324a. One proof mass 322a may be arranged towards one end portion of the energy harvesting element 305a while another proof mass 324a may be arranged towards the opposite end portion of the energy harvesting element 305a.

Each energy harvesting elements 305a, 305b, 305c, 305d, 305e, 305f may have at least one tapering structure or region. Using the energy harvesting element 305a as an example, the energy harvesting element 305a may have a respective tapering structure in a direction towards its respective proof masses 322a, 324a, where the width decreases in the direction towards its respective proof masses 322a, 324a.

It should be appreciated that the descriptions in the context of the energy harvesting element 305a may be applicable to each of the other energy harvesting elements 305b, 305c, 305d, 305e, 305f of the energy harvesting device 300e.

The energy harvesting device 300e may further include a plurality of springs (or soft springs) for mechanically coupling the energy harvesting elements 305a, 305b, 305c, 305d, 305e, 305f to each other. For example, a spring 311a may be provided for mechanically coupling the energy harvesting elements 305a, 305b (e.g., adjacent or directly adjacent energy harvesting elements) to each other. The spring 311a may be coupled to the respective regions of the energy harvesting elements 305a, 305b where the proof masses 322a, 322b may be arranged, so as to mechanically couple the energy harvesting elements 305a, 305b to each other. In this way, the spring 311a may couple the proof masses 322a, 322b to each other. Similarly, for example, a spring 313a may be provided to mechanically couple the energy harvesting elements 305a, 305b (e.g., adjacent or directly adjacent energy harvesting elements) to each other, for example, coupled to the respective regions of the energy harvesting elements 305a, 305b where the proof masses 324a, 324b may be arranged. Similarly, for example, a spring 311d may be provided to mechanically couple the energy harvesting elements 305d, 305e (e.g., adjacent or directly adjacent energy harvesting elements) to each other.

For ease of understanding and clarity purposes, the piezoelectric transducer on each energy harvesting element 305a, 305b, 305c, 305d, 305e, 305f is not shown in FIG. 3E. However, it should be appreciated that the structure, including a piezoelectric transducer, for each of the energy harvesting elements 305a, 305b, 305c, 305d, 305e, 305f may be as correspondingly described in the context of the energy harvesting element 302a of the energy harvesting device 300a, and with reference to FIG. 3F.

Figure 3G:
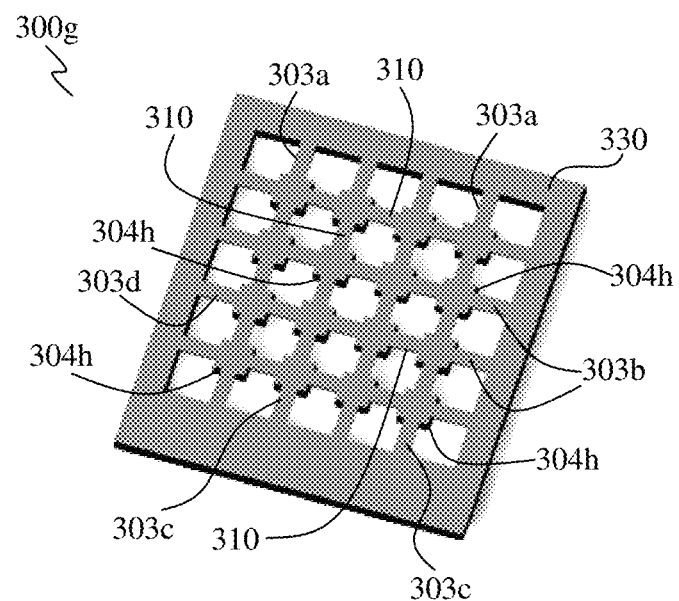
FIGS. 3G and 3H show schematic perspective views of respective energy harvesting devices, according to various embodiments.

Referring to FIG. 3G, the energy harvesting device 300g may include a plurality of energy harvesting elements, represented as 303a, 303c, arranged on opposite sides and a plurality of energy harvesting elements, represented as 303b, 303d, arranged on opposite sides. The plurality of energy harvesting elements 303a, 303b, 303c, 303d may be arranged spaced apart from each other. In various embodiments, the energy harvesting elements 303a, 303c may be arranged along a first direction, while the energy harvesting elements 303b, 303d may be arranged along a second direction. The first and second directions may be at least substantially orthogonal to each other. Accordingly, the energy harvesting device 300g may include a 2D array of energy harvesting elements 303a, 303b, 303c, 303d.

For ease of understanding and clarity purposes, the piezoelectric transducer on each energy harvesting element 303a, 303b, 303c, 303d is not shown in FIG. 3G. However, it should be appreciated that the structure, including a piezoelectric transducer, for each of the energy harvesting elements 303a, 303b, 303c, 303d may be as correspondingly described in the context of the energy harvesting element 302a of the energy harvesting device 300a, and with reference to FIG. 3F.

The energy harvesting device 300g may further include a plurality of proof masses, represented as 304h. The proof masses 304h may be arranged spaced apart from each other.

In various embodiments, one end of each energy harvesting element 303a, 303b, 303c, 303d may be coupled (e.g., rigidly fixed) to a support structure (e.g., a frame structure) 330.

The energy harvesting device 300g may further include a plurality of springs (e.g., soft springs), represented as 310, for coupling the energy harvesting elements 303a, 303b, 303c, 303d to each other. For example, a respective spring 310 may be arranged to mechanically couple two energy harvesting elements 303a, 303b, 303c, 303d (e.g., adjacent or directly adjacent energy harvesting elements) to each other. For example, a respective spring 310 may be coupled to the respective regions of the two energy harvesting elements where the proof masses may be arranged, so as to mechanically couple the two energy harvesting elements to each other. In this way, the respective spring 310 may couple the proof masses to each other.

In various embodiments, some proof masses 304h may be arranged along a longitudinal axis of a respective energy harvesting element 303a, 303b, 303c, 303d. Each spring 310 may have a spring constant that is less than a spring constant of each energy harvesting element 303a, 303b, 303c, 303d. Each spring 310 may have or consist of a linear structure. However, it should be appreciated that each spring 310 may have a folded structure having at least two parallel segments as described in the context of the spring 306, 308, or having a quadrilateral structure as described in the context of the spring 307a, 307b, 309a, 309b.

Figure 3H:
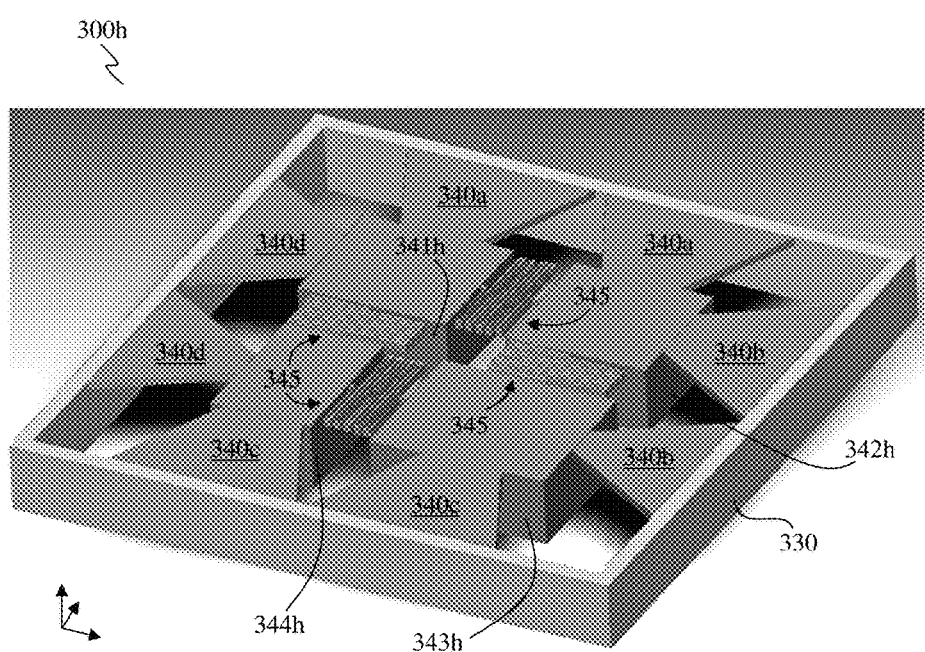

Referring to FIG. 3H illustrating a 2D (two-dimensional) EH array which may be mechanically connected through the proof masses with soft springs, the energy harvesting device 300h may include a plurality of energy harvesting elements, represented as 340a, 340c, arranged on opposite sides and a plurality of energy harvesting elements, represented as 340b, 340d, arranged on opposite sides. The plurality of energy harvesting elements 340a, 340b, 340c, 340d may be arranged spaced apart from each other. In various embodiments, the energy harvesting elements 340a, 340c may be arranged along a first direction, while the energy harvesting elements 340b, 340d may be arranged along a second direction. The first and second directions may be at least substantially orthogonal to each other. Accordingly, the energy harvesting device 300h may include a 2D array of energy harvesting elements 340a, 340b, 340c, 340d.

For ease of understanding and clarity purposes, the piezoelectric transducer on each energy harvesting element 340a, 340b, 340c, 340d is not shown in FIG. 3H. However, it should be appreciated that the structure, including a piezoelectric transducer, for each of the energy harvesting elements 340a, 340b, 340c, 340d may be as correspondingly described in the context of the energy harvesting element 302a of the energy harvesting device 300a, and with reference to FIG. 3F.

The energy harvesting device 300h may further include a plurality of proof masses, represented as 341h, 342h, 343h, 344h. The proof masses 341h, 342h, 343h, 344h may be arranged spaced apart from each other.

In various embodiments, one end of each energy harvesting element 340a, 340b, 340c, 340d may be coupled (e.g., rigidly fixed) to a support structure (e.g., a frame structure) 330.

The energy harvesting device 300h may further include a plurality of springs, represented as 345, for mechanically coupling the energy harvesting elements 340a, 340b, 340c, 340d (e.g., adjacent or directly adjacent energy harvesting elements) to each other. The springs 345 may be coupled to the respective regions of the energy harvesting elements 340a, 340b, 340c, 340d where the proof masses 341h, 342h, 343h, 344h may be arranged, so as to mechanically couple the energy harvesting elements 340a, 340b, 340c, 340d to each other. In this way, the springs 345 may couple the proof masses 341h, 342h, 343h, 344h to each other, e.g., 341h and 342h, 342h and 343h, 343h and 344h, 344h and 341h.

Each spring 345 may have a spring constant that is less than a spring constant of each energy harvesting element 340a, 340b, 340c, 340d. Each spring 345 may have a folded structure having at least two parallel segments as described in the context of the spring 306, 308.

Each energy harvesting element 340a, 340b, 340c, 340d may have a tapering structure or region. Using the energy harvesting element 340a with the associated proof mass 341h as an example, the energy harvesting element 340a may have a tapering structure in a direction towards the proof mass 341h where the width decreases in the direction towards the proof mass 341h, away from the support structure 330.

As illustrated in FIG. 3H, at least one dimension (e.g., width and/or height (thickness) and/or length) of each proof mass 341h, 342h, 343h, 344h may be different from that of another proof mass 341h, 342h, 343h, 344h.

As described above referring to FIGS. 3A to 3H, the energy harvesting devices 300a, 300b, 300c, 300d, 300e, 300g, 300h may include a 1D or 2D array of energy harvesting elements with springs (or soft springs) connecting the energy harvesting elements together through the proof masses. In various embodiments, the resonance frequency of each energy harvesting element may be different. In various embodiments, the spring constant of the spring or soft spring may be much smaller than each energy harvesting element beam.

Each energy harvesting element as described in the context of the energy harvesting devices 300a, 300b, 300c, 300d, 300e, 300g, 300h may include a transducer for harvesting energy, e.g., for harvesting ambient vibration energy.

The proof masses as described in the context of the energy harvesting devices 300a, 300b, 300c, 300d, 300e, 300g, 300h may include silicon (Si).

The support structure 330 may include silicon (Si).

It should be appreciated that the energy harvesting element 302a as illustrated in FIG. 3F and the associated descriptions may be correspondingly applied to any of the main beam and/or additional beam of the energy harvesting device 250a, 250b, 250c, 250d, 250e, 250f (FIGS. 2A to 2F).

It should be appreciated that in various embodiments, one or more of the energy harvesting elements of an energy harvesting device may be different in at least one dimension (e.g., width and/or height (thickness) and/or length) from another energy harvesting element.

It should be appreciated that in various embodiments, one or more of the proof masses of an energy harvesting device may be different in at least one dimension (e.g., width and or height (thickness) and/or length) from another proof mass.

It should be appreciated that any number (at least two) of energy harvesting elements may be provided for the energy harvesting devices 300a, 300b, 300c, 300d, 300e, 300g, 300h, with the associated transducers, and springs. The corresponding proof masses may also be provided.

The energy harvesting devices as described in the context of FIGS. 2A to 2F and 3A to 3G may provide a multiple degrees of freedom device or system. When the resonance frequency of each mode is quiet different, the energy harvesting device may exhibit multi mode frequency response. If the resonant frequency of these modes are close with little difference, the energy harvesting device may realize broadband energy harvesting with a wideband frequency peak, which may result in the improvement of the energy harvesting performance.

In various embodiments, an energy harvesting device or system with multiple proof masses may be provided to realize multiple degrees of freedom systems. Further, an energy harvester array (e.g., having a plurality of energy harvesting elements) may be mechanically connected by one or more soft springs through their respective proof masses to realize broadband energy harvesting, which may simplify the electrical circuit that may be needed.

For conventional energy harvesters, it is very difficult to harvest energy from a wide frequency range by using a single EH or a single energy harvesting element. Additional electrical circuitry as well as multiple energy harvester sensors are needed to harvest wide frequency band energy with these arrays. In contrast, in various embodiments, a single energy harvester (or energy harvesting element) with multiple proof masses may realize multiple frequency responses. A series of structural design may be used for optimization of the broadband energy harvesting capability. In various embodiments, soft springs may be used to connect the proof masses of an array of energy harvesting elements to increase damping ratio and provide a broad energy harvesting frequency band.

As described above, a piezoelectric structure or thin film may be employed, working as a device sensing layer. Further, piezoelectric sensing beams with a proof mass may be used for sensing vibration sources.

In various embodiments, the operating frequency range of the energy harvesting device may be pre-defined by mechanical design. For example, multiple beams with proof masses may be designed for multiple degrees of freedom systems, as described in the context of the embodiments illustrated in FIGS. 2A to 2F and 3A to 3G. Further, soft springs may be designed in the beam layer which may connect the different proof masses of the EH device or system to increase the mechanical damping ratio and/or provide a wide band operating frequency range, as described in the context of the embodiments illustrated in FIGS. 3A to 3G.

The energy harvesting device of various embodiments may effectively harvest energy from a wide frequency band ambient energy sources including, but not limited to, structural health monitoring (e.g., in the frequency range of about 1-10 Hz), medical (about 0.1-100 Hz), mobile (about 1-100 Hz) and automotives (about 10-10,000 Hz), etc.

For the MEMS fabrication of the energy harvesting devices of various embodiments, the proof mass (e.g., made of silicon (Si)) and the suspended beams or carriers (e.g., made of silicon (Si)) of the energy harvesting elements may be shaped by front and backside deep reactive ion etching (DRIE). The top electrode(s) on each beam may be patterned based on the principles of a cantilever. All the piezoelectric thin film transducers may be connected through the bottom electrode that may be formed between the piezoelectric film of the transducer and the substrate (e.g., a silicon (Si) substrate), while the output electrical signals from the transducers may be parallelly connected.

When the energy harvesting device is subjected to vibration (e.g., vertical vibration), the beams (e.g., suspending flexural beams) may effectively convert the vertical force of the associated proof mass into a planar stress in the transverse direction of the piezoelectric thin film or piezoelectric structure. Thus, the energy harvesting device may generate an electrical energy in the piezoelectric film.

In various embodiments, three parameters that may be used for determining the frequency band of the energy harvester may include the proof mass, the beam dimensions and the elastic properties of the device material. At least one of the three parameters may be changed to change the frequency band of the energy harvesting device. Beam dimensions may refer to the dimensions of the energy harvesting element and/or its associated carrier. Through adjusting the dimensions of the device (e.g., including those of the beam and/or the proof mass), energy harvesters with multiple frequency bands, meaning energy harvesting devices that may be operable in various frequency bands, may be designed on the same wafer to fit different vibration sources.

In various embodiments, for a piezoelectric transducer, the piezoelectric material that may be employed may include any piezoelectric material such as, but not limited to, aluminum nitride (AlN), zinc oxide (ZnO), lithium niobate (LiNbO$_3$), or lead zirconium titanate (PZT).

Analysis results for the energy harvesting devices of various embodiments will now be described by way of the following non-limiting examples. Simulation may be performed to study the behavior of the multiple resonant vibrations of the broadband energy harvesting devices of various embodiments.

Figure 4A:
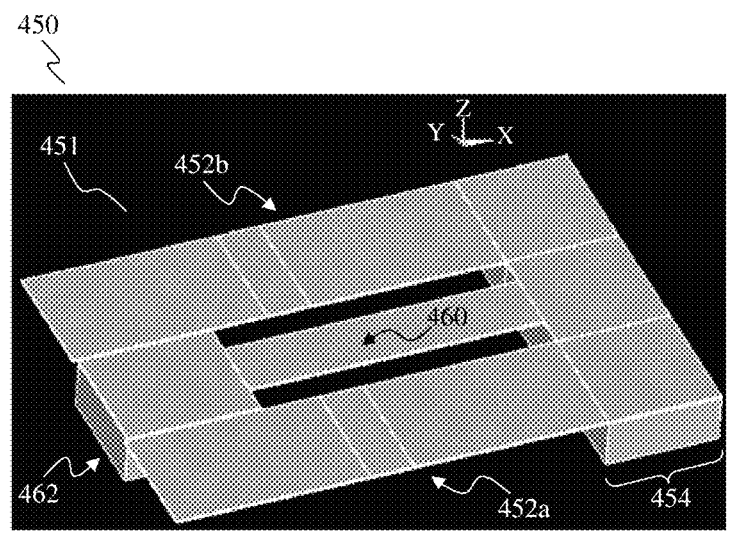
FIG. 4A shows an energy harvesting device, according to various embodiments.

In order to study the performance of the broadband energy harvester of various embodiments, a cantilever beam may be used, with an additional cantilever beam inside the main beam as an example, as shown in FIG. 4A.

FIG. 4A shows an energy harvesting device 450, illustrating the configuration of the broadband energy harvesting element of various embodiments. The energy harvesting device 450 may include an energy harvesting element 451 having a main beam, for example made up of a first main beam portion 452a and a second main beam portion 452b, with a main proof mass 454 at the end. The energy harvesting element 451 may further include an additional beam 460 with an additional proof mass 462 at its end. The energy harvesting device 450 may correspond to the energy harvesting devices of the embodiments illustrated in FIG. 2.

Figure 4B:
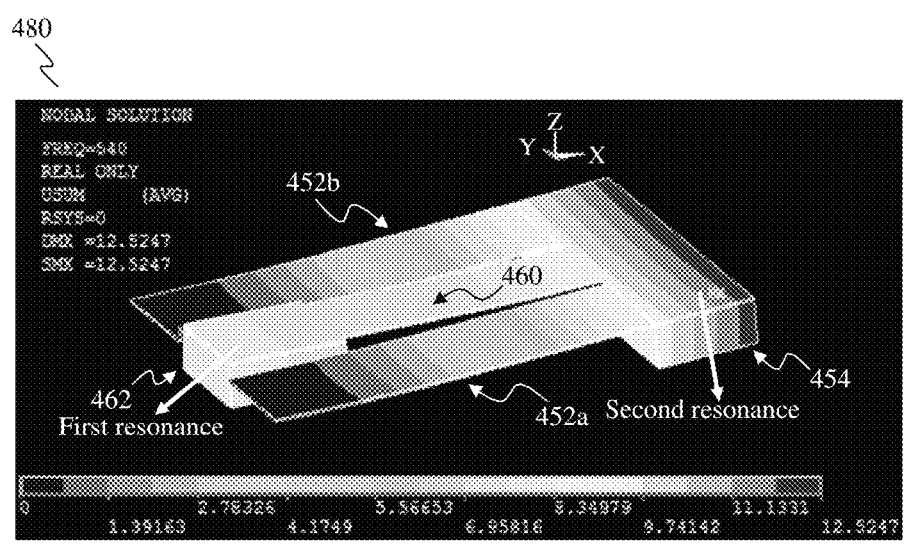
FIGS. 4B and 4C show simulation results relating to the energy harvesting device of the embodiment of FIG. 4A.
Figure 4C:
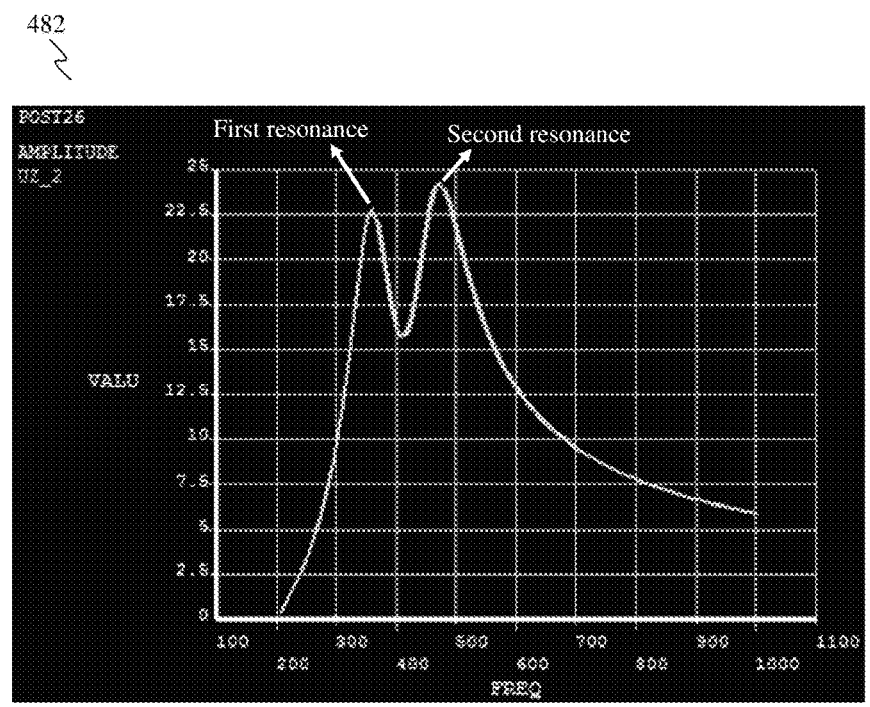

FIGS. 4B and 4C show simulation results relating to the energy harvesting device 450, illustrating the results relating to the different vibration modes and the displacement of the broadband energy harvesting elements. FIG. 4B shows a harmonic analysis of the broadband energy harvesting device 450 using an engineering simulation software.

As shown in FIGS. 4B and 4C, the two proof masses 454, 462 and the beams 452a, 452b, 460 may cause the energy harvesting device 450 to have two resonances in the displacement frequency response, which may generate a planar stress in the transverse direction of the device beams 452a, 452b, 460, and thus piezoelectric energy may be generated. The results clearly show that the frequency band may be widened by the two resonances (first resonance and second resonance), as may be observed in FIG. 4C illustrating the displacement response of the broadband energy harvesting elements.

It should be appreciated that by using the same mechanism, the other designs, for example, relating to the energy harvesting devices of the embodiments illustrated in FIG. 3, may also show a similar broadband property.

Figure 5A:
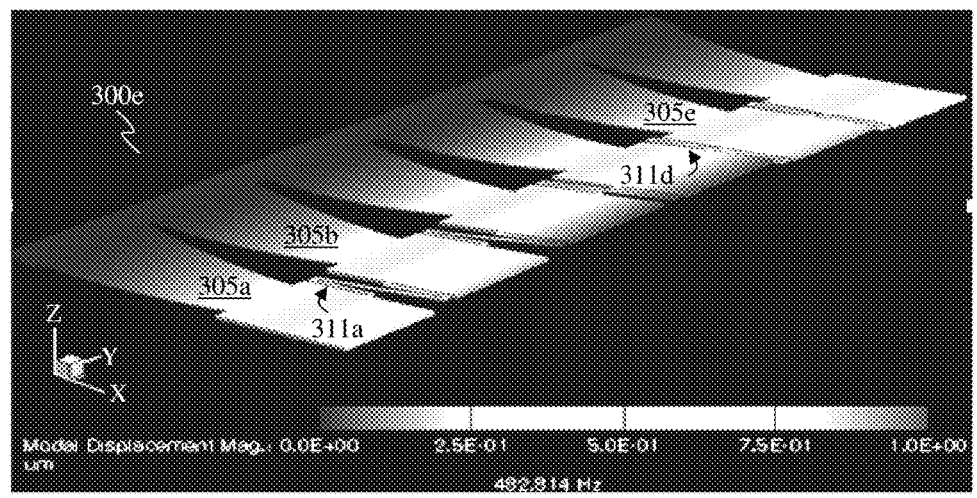
Figure 5B:
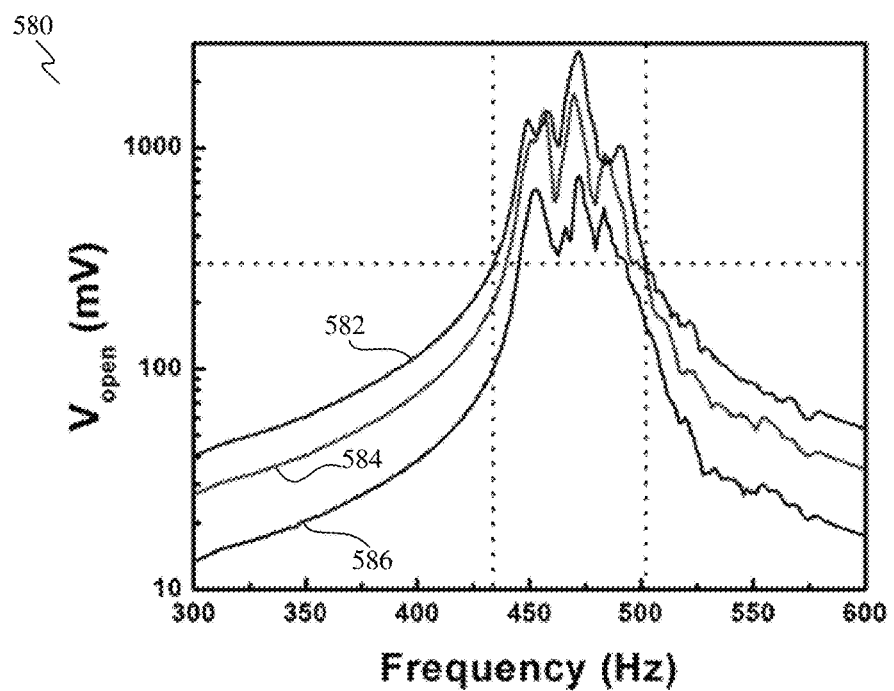
FIG. 5B shows a plot of the associated output voltage as a function of frequency.

FIG. 5A shows a model analysis of one half of the energy harvesting device 300e, illustrating different vibrations of different energy harvesting elements. FIG. 5B shows a plot 580 of the associated output voltage as a function of frequency, illustrating the tested voltage output versus frequency under respective 1G (result 586), 2G (result 584) and 3G (result 582) accelerations.

As described above, various embodiments may provide an energy harvester (or energy harvesting device) with a broadband frequency response. Two methods have been described. In the first method, the energy harvesting device may be evaluated as a single device which may include a main structure (or main beam) and one or more additional beams (e.g., cantilevers). The second method may include using EH 1D or 2D arrays, in which, the proof masses may be mechanically connected by soft springs which may be fabricated simultaneously with the functional beams of the EH 1D or 2D arrays. Both of these two methods may form a multi-degree of freedom system by using multiple proof masses and beams. Multiple degrees of freedom systems may provide a broadband strategy for harvesting multiple-frequency or wide frequency band ambient energy with high efficiency. The multiple proof masses employed may produce multiple mode vibrations. Energy harvesting elements connected by soft springs on the respective proof masses may increase mechanical damping and generate broadband vibrations. When the modes (e.g., the resonant modes) are close enough, the frequency response of the energy harvesting device may exhibit broadband properties; when the modes (e.g., the resonant modes) are quite different, multi resonances and large frequency bands may be observed in the frequency response of the energy harvesting device.

Various embodiments may aim towards harvesting energy from a frequency-varying or random vibration source. As described above, an analysis has been done to demonstrate the broadband performance of the energy harvesting device based on MEMS technology. The analytical results for the device indicate that the harvesting frequency bands of the energy harvesters may be broadened by using the design as described above. The resonant frequency of the energy harvester may be tuned by adjusting the dimensions of the beams and/or proof masses.

Various embodiments may provide one or more of the following: (1) the energy harvesting device of various embodiments may be fabricated using CMOS (complementary metal-oxide-semiconductor) compatible process (e.g., using a piezoelectric thin film such as aluminium nitride (AlN)); (2) harvesting energy from wide frequency range vibration sources with higher efficiency; (3) additional electrical circuit that may be needed may be simplified; or (4) the energy harvesting device of various embodiments may provide a high energy harvesting efficiency, which may help to shrink the device size and extend the application platforms.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An energy harvesting device comprising:
a plurality of energy harvesting elements, each energy harvesting element comprising a transducer; and
at least one spring arranged in between at least two energy harvesting elements of the plurality of energy harvesting elements, wherein the at least two energy harvesting elements are connected by the at least one spring to mechanically couple the at least two energy harvesting elements to each other to provide broadband energy harvesting.

2. The energy harvesting device as claimed in claim 1, wherein a spring constant of the at least one spring is less than a spring constant of each energy harvesting element of the plurality of energy harvesting elements.

3. The energy harvesting device as claimed in claim 1, wherein at least one energy harvesting element of the plurality of energy harvesting elements is arranged along a first direction, and wherein at least one other energy harvesting element of the plurality of energy harvesting elements is arranged along a second direction different from the first direction.

4. The energy harvesting device as claimed in claim 1, wherein each energy harvesting element of the plurality of energy harvesting elements further comprises at least one proof mass.

5. The energy harvesting device as claimed in claim 4, wherein the at least one proof mass is arranged at an end portion of the energy harvesting element, or at a central portion of the energy harvesting element.

6. The energy harvesting device as claimed in claim 1, wherein each energy harvesting element of the plurality of energy harvesting elements further comprises two proof masses arranged on opposite end portions of the energy harvesting element.

7. The energy harvesting device as claimed in claim 1, wherein the plurality of energy harvesting elements have respective resonant frequencies different from each other.

8. The energy harvesting device as claimed in claim 1, wherein each energy harvesting element of the plurality of energy harvesting elements is configured to vibrate in response to kinetic energy acting on the energy harvesting device.

9. The energy harvesting device as claimed in claim 1, wherein the transducer comprises at least one of a piezoelectric transducer, an electrostatic transducer or an electromagnetic transducer.

10. The energy harvesting device as claimed in claim 9, wherein the piezoelectric transducer comprises a first electrode, a second electrode, and a piezoelectric structure arranged in between the first and second electrodes.

11. The energy harvesting device as claimed in claim 10, wherein the first electrode comprises a plurality of electrode portions electrically isolated from each other.

12. The energy harvesting device as claimed in claim 1, wherein each energy harvesting element of the plurality of energy harvesting elements comprises a cantilever beam or a double clamped beam.

13. The energy harvesting device as claimed in claim 1, further comprising a support structure, wherein at least one end of each energy harvesting element of the plurality of energy harvesting elements is coupled to the support structure.

14. The energy harvesting device as claimed in claim 1, further comprising a support structure, wherein respective central portions of some of the plurality of energy harvesting elements are coupled to the support structure.

15. The energy harvesting device as claimed in claim 1, wherein the at least one spring comprises a linear structure, a quadrilateral structure, or a folded structure having at least two parallel segments.

16. The energy harvesting device as claimed in claim 1, wherein each energy harvesting element of the plurality of energy harvesting elements comprises a tapering structure.

17. A method for forming an energy harvesting device, the method comprising: forming a plurality of energy harvesting elements, each energy harvesting element comprising a transducer; and arranging at least one spring in between at least two energy harvesting elements of the plurality of energy harvesting elements, wherein the at least two energy harvesting elements are connected by the at least one spring to mechanically couple the at least two energy harvesting elements to each other to provide broadband energy harvesting.

18. The method as claimed in claim 17, wherein a spring constant of the at least one spring is less than a spring constant of each energy harvesting element of the plurality of energy harvesting elements.

19. The method as claimed in claim 17, wherein each energy harvesting element of the plurality of energy harvesting elements further comprises at least one proof mass.

* * * * *